United States Patent [19]

Ibi

[11] Patent Number: 5,033,001
[45] Date of Patent: Jul. 16, 1991

[54] DUAL MODE MEMORY READ CYCLE TIME REDUCTION SYSTEM WHICH GENERATES READ DATA CLOCK SIGNALS FROM SHIFTED AND SYNCHRONIZED TRIGGER SIGNALS

[75] Inventor: Takashi Ibi, Kawasaki, Japan

[73] Assignee: Fujitsu Limited, Kawasaki, Japan

[21] Appl. No.: 134,860

[22] Filed: Dec. 18, 1987

[30] Foreign Application Priority Data

Dec. 19, 1986 [JP] Japan ............... 61-301621

[51] Int. Cl.$^5$ .............. G06F 13/00; G06F 1/04; G06F 5/06
[52] U.S. Cl. ................ 364/200; 364/270; 364/270.3; 364/271; 364/238.6; 364/238.7; 364/271.5; 364/271.6; 364/239; 364/239.1; 364/244.5; 364/244; 364/934; 364/934.2; 364/934.4; 364/933.2; 364/933.7; 364/939.4; 364/968; 364/965.7; 364/965; 364/950; 364/950.3; 364/950.4
[58] Field of Search ... 364/200 MS File, 900 MS File; 365/222

[56] References Cited

U.S. PATENT DOCUMENTS

| | | | |
|---|---|---|---|
| 4,050,096 | 9/1977 | Bennett | 364/200 |
| 4,050,097 | 9/1977 | Miu | 364/200 |
| 4,161,778 | 7/1979 | Getsou, Jr. | 364/200 |
| 4,231,084 | 10/1980 | Yoshizaki | 364/200 |
| 4,258,430 | 3/1981 | Tyburski | 364/900 |
| 4,328,558 | 5/1982 | Musa | 364/900 |
| 4,456,970 | 6/1984 | Catiller | 364/900 |
| 4,462,072 | 7/1984 | Tague | 364/200 |
| 4,476,543 | 10/1984 | Quinones | 364/900 |
| 4,503,525 | 3/1985 | Milak | 365/222 |
| 4,567,571 | 1/1986 | Moffett | 365/222 |
| 4,574,351 | 3/1986 | Dang | 364/200 |
| 4,574,394 | 3/1986 | Holsztynski | 364/200 |
| 4,580,216 | 4/1986 | Bellay | 364/200 |
| 4,607,348 | 8/1986 | Sheth | 364/900 |
| 4,613,936 | 9/1986 | Andresen | 364/200 |
| 4,631,702 | 12/1986 | Korba | 364/900 |
| 4,644,463 | 2/1987 | Hotchkin et al. | 364/200 |
| 4,654,848 | 3/1987 | Noguchi | 371/20 |
| 4,660,155 | 4/1987 | Thaden | 364/200 |
| 4,701,845 | 10/1987 | Andreason et al. | 364/200 |
| 4,712,190 | 12/1987 | Guglielmi | 364/900 |
| 4,796,223 | 1/1989 | Sugita | 364/900 |
| 4,833,600 | 5/1989 | Brodsky | 364/200 |
| 4,945,471 | 7/1990 | Neches | 364/200 |

OTHER PUBLICATIONS

Motorola MC68020, 32-Bit Microprocessor User's Manual, Motorola Inc., Prentice Hall, Pub., 1985, pp. 2-1-2-5.

Primary Examiner—Archie E. Williams, Jr.
Assistant Examiner—Eric Coleman
Attorney, Agent, or Firm—Staas & Halsey

[57] ABSTRACT

An apparatus for reading data from a memory in a computer system includes: an address register for holding an address to be supplied to the memory, a read data register for holding data read out from the memory and a device for generating a gated clock signal from a free-running clock signal having a predetermined constant period of time. The gated clock signal is free-running with the predetermined constant period of time in a normal clock mode but is generated by a single pulse with an interval longer than the period of the free-running clock signal in a single clock mode. A device, having serially connected plural registers for shifting a trigger signal in accordance with the free-running clock signal generates a read data clock signal. The trigger signal has a same timing synchronized with a specific phase of the gated clock signal at which a phase of the address register is switched to hold a new address to be supplied to the memory. The shifted trigger signal is fed to the read data register for hodling the data read out from the memory.

4 Claims, 7 Drawing Sheets

DUAL MODE MEMORY READ CYCLE TIME REDUCTION SYSTEM WHICH GENERATES READ DATA CLOCK SIGNALS FROM SHIFTED AND SYNCHRONIZED TRIGGER SIGNALS

BACKGROUND OF THE INVENTION

1. Field of the Invention

The present invention relates to an apparatus for reading data from a memory and particularly to a read data clock signal generation circuit for generating a read data clock signal to read the data. The present invention can shorten a read cycle time for the data, and thus can raise the throughput of a computer system.

2. Description of the Related Art

In the computer system, as is well known, data stored in a memory (RAM) is read in response to an address signal and a chip selection signal transmitted from a central processing unit (CPU). In this case, the arrival of these signals at the RAM is delayed due to the length of the wiring pattern between the CPU and the RAM on the printed circuit board. Further, output of the read data is also delayed for a certain access time due to a transmission delay time within each RAM. In this case, it is difficult to shorten the transmission delay time caused for the above reasons because of the structural factor when designing a large scale integrated circuit (LSI). Therefore, for the same reasons, it is also difficult to shorten the read cycle time for improving the throughput of the computer system by reducing the transmission delay time. However, it is relatively easy to shorten the read cycle time by reducing a number of clock cycles between address sending and receiving data, but in this case, a problem occurs regarding the timing between the clock signal and the read data clock signal when the computer system has a single clock mode for diagnostic purposes. This problem is explained in detail hereinafter.

SUMMARY OF THE INVENTION

The primary object of the present invention is to provide an apparatus for reading data from a memory, which enables a shortening of a read cycle time, and thus provides an improvement of the throughput of the computer system.

Another object of the present invention is to provide a read data clock signal generation circuit for generating a read data clock signal operable in both a normal clock mode and a single clock mode.

In accordance with the present invention, there is provided an apparatus for reading data from a memory in a computer system comprising: an address register for holding an address to be supplied to the memory; a read data register for holding data read out from the memory; device for generating a gated clock signal from a free-running clock signal having a predetermined constant period of time, where the gated clock signal is free-running with the constant period of time in a normal clock mode but is generated by a single pulse with an interval longer than the period of time of the free-running clock signal in the single clock mode; and a device having serially connected plural registers for shifting a trigger signal in accordance with the free-running clock signal, for generating a read data clock signal, where the trigger signal has a same timing synchronized with a specific phase of the gated clock signal at which the address register is switched to hold a new address to be supplied to the memory, and the shifted trigger signal is fed to the read data register for holding the data read out from the memory.

DESCRIPTION OF THE PREFERRED EMBODIMENTS

Before describing the preferred embodiments, an explanation will be given of a conventional method for reading data from the memory, and the problems thereof, with reference to FIGS. 1 to 3.

Figure 1:
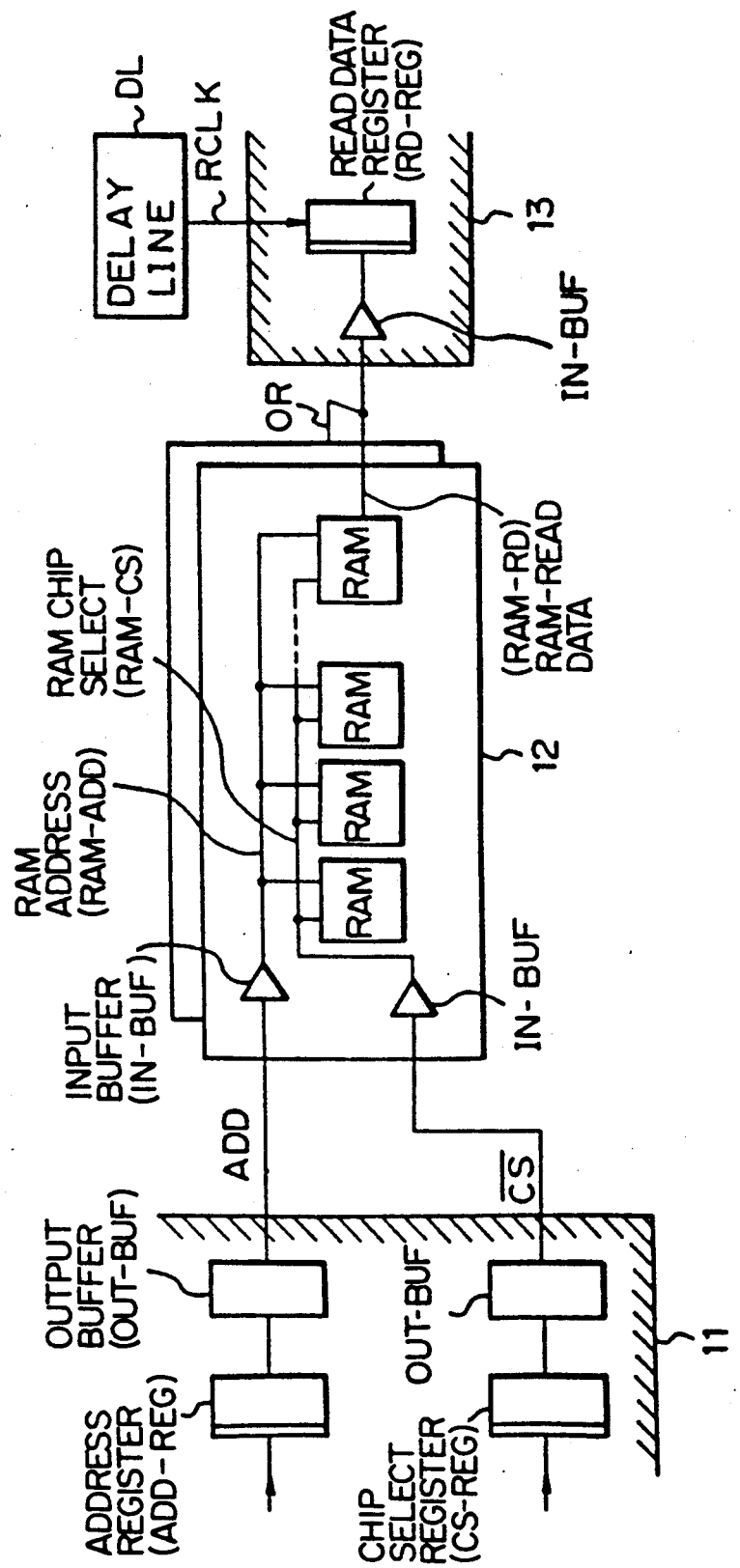
FIG. 1 is a schematic block diagram of a conventional system.

In FIG. 1, ADD-REG represents an address register, CS-REG a chip selection register, and OUT-BUF an output buffer. These elements are provided in a large-scale integrated circuit (LSI)11. IN-BUF represents an input buffer, and RAM a random access memory. These elements are provided in an array card 12. RD-REG represents a read data register. ADD represents an address signal generated from the register ADD-REG through the buffer OUT-BUF. $\overline{CS}$ represents a chip selection signal generated from the register CS-REG through the buffer OUT-BUF. The output buffer OUT-BUF and the input buffer IN-BUF are provided for matching a voltage level between an ECL level and a TTL level.

A plurality of RAM's are provided in each array card 12. Usually, one memory bank consists of by a plurality of the array cards and these array cards are added in accordance with the increase of the memory size. Any one of the array cards is selected by a card selection signal not shown in FIG. 1. RAM-ADD represents a RAM address signal after selection, and RAM-CS a RAM selection signal after selection. RAM-RD represents read data from the selected array card after taking a "wired OR logic" among outputs from other array cards. The data RAM-RD is input to the register RD-REG through the buffer IN-BUF in an LSI 13. The register RD-REG is provided for temporarily storing the data read from the RAM.

In this structure, the signals ADD and $\overline{CS}$ are transferred to the RAM through a relatively long wiring pattern between the LSI 11 and the array card 12 on a printed circuit board. The data RAM-RD is transferred to the register RD-REG also through a relatively long wiring pattern between the array card 12 and the LSI 13. Therefore, these signals are considerably delayed because of the length of the long wiring pattern.

Figure 2:
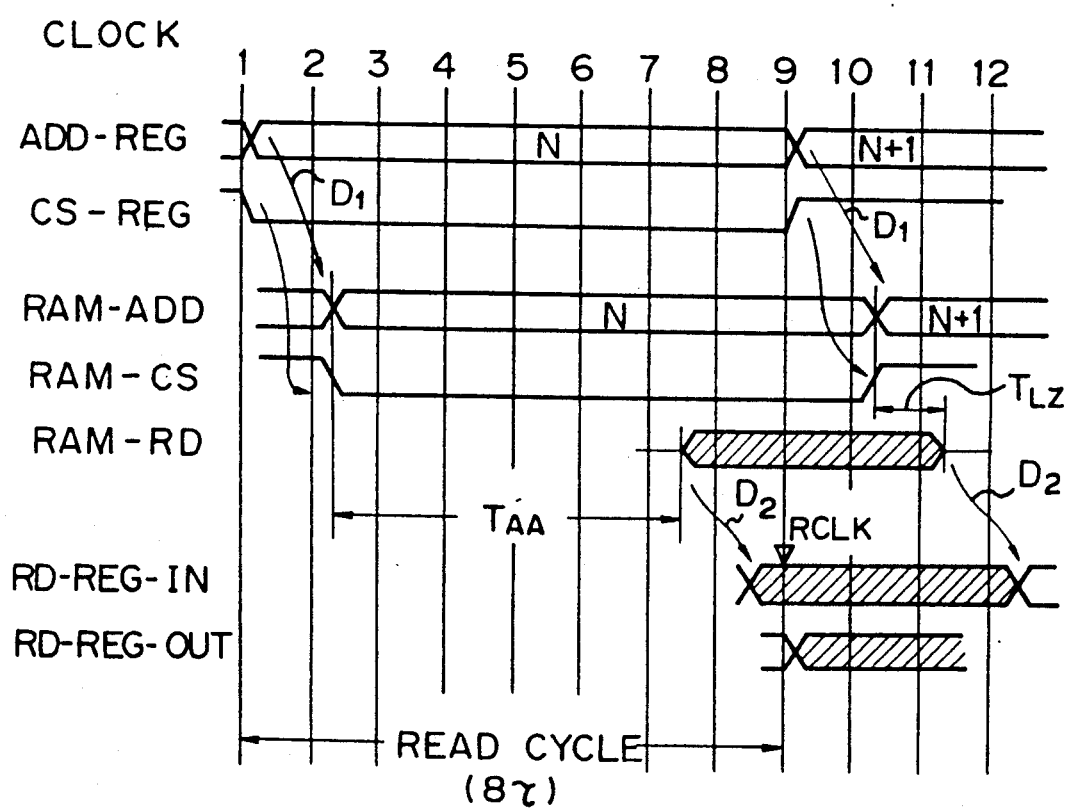
FIGS. 2 and 3 are signal timing charts of a conventional method.

In FIG. 2, a first clock pulse 1 is input to the registers ADD-REG, and CS-REG. This clock is a gated clock generated by the CPU. The signals RAM-ADD and RAM-CS are input to the RAM after a delay $D_1$ caused by the long wiring pattern. The data RAM-RD is output from the RAM after the time $T_{AA}$, which is the maximum access delay time of the RAM. This time $T_{AA}$ cannot be shortened because of the delay peculiar to the RAM. The data RAM-RD is input to the register RD-REG after the delay $D_2$, also caused by the long wiring pattern, and set in the register RD-REG in response to a read data clock signal RCLK. The signal RCLK is generated from the delay line DL of FIG. 1 a single clock mode, or generated from a clock signal in a normal clock mode.

As is obvious from the timing chart, the register ADD-REG is switched to the next address (N+1) when the ninth clock pulse 9 is input and the signal RAM-ADD is also switched to the next address (N+1) after the delay $D_1$. When the signal RAM-CS is finished at the same timing for switching to the next address (N+1), the data RAM-RD is also finished after the delay time $T_{LZ}$. In this case, the data RAM-RD is valid during three cycles (3τ) from the clock pulses 9 to 12, as shown by the hatched portion float the RD-REG-IN. However, in practice, the time necessary for loading the data into the register RD-REG is very short. Therefore, the above three-cycle time (3τ) is too long and almost all of this time is unnecessary. Further, the read cycle time from the register RD-REG is "8τ" and this read cycle time (8τ) is very large compared with the delay time $T_{AA}$. This large read cycle (8τ) is dependent on the delay $D_1$, $D_2$ caused by the long wiring patterns and on the three cycles (3τ) for holding the data in the register RD-REG. In this case, as explained above, the delay time $T_{AA}$, $D_1$ and $D_2$ are dependent on structural factors, and therefore, it is difficult to shorten these delay times, but it is possible to reduce the number of clock cycles defining a single read cycle time.

Figure 3:
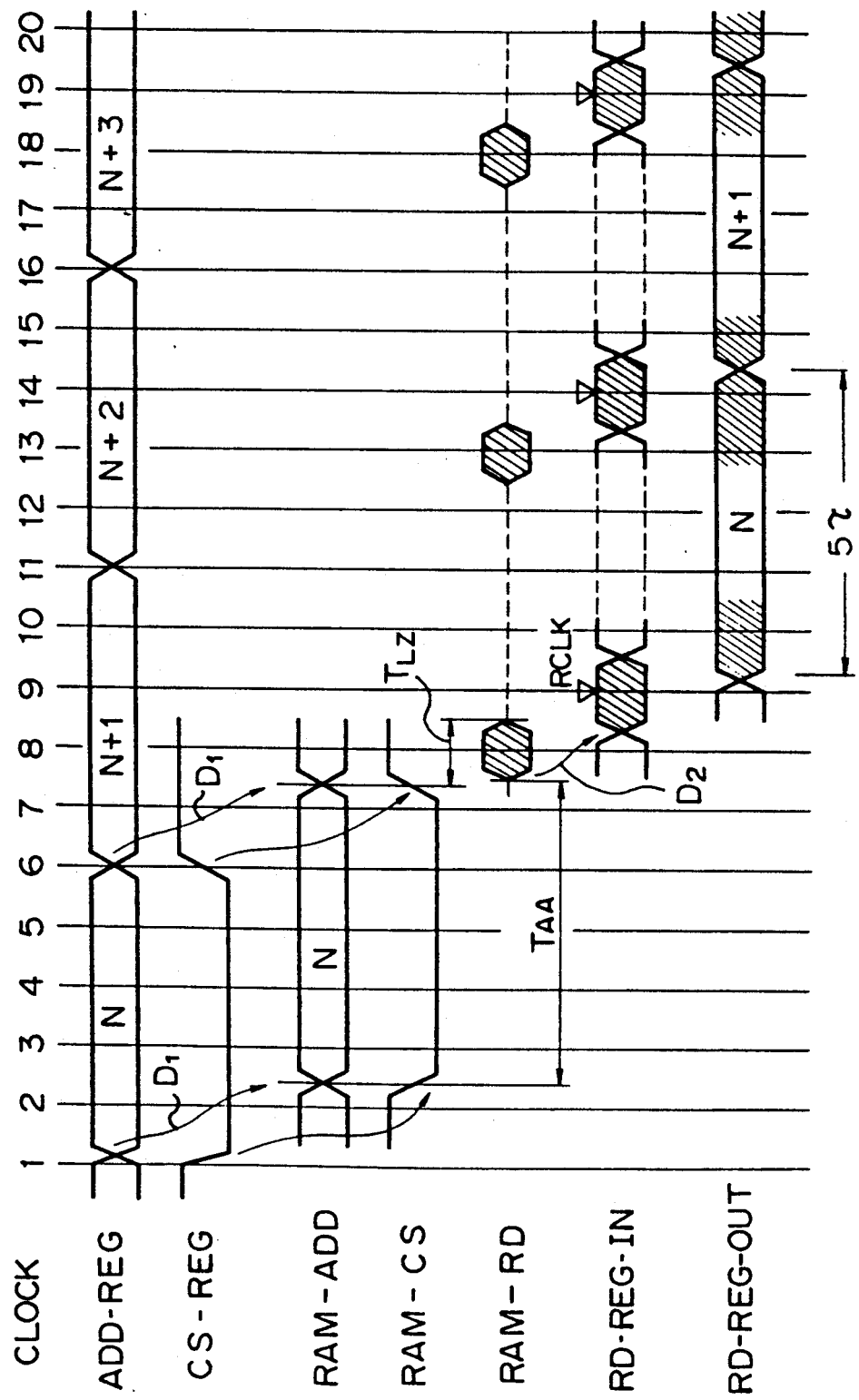

One method shown in FIG. 3 has been proposed in order to solve the above long read cycle time. In this method, the register ADD-REG is switched when the sixth clock pulse 6 is input thereto. Therefore, since the signal RAM-CS is finished at the same timing for RAM-Add switching to the next address (N+1), the data RAM-RD is also finished after the delay time $T_{LZ}$. In this case, the data RAM-RD is valid during approximately one cycle time, as shown by the slant portion at the RD-REG-IN. Therefore, the read cycle time can be shortened to the five cycle time (5τ), as shown by the RD-REG-OUT in FIG. 3.

The above method is suitable for the normal clock mode, but unsuitable for the single clock mode for the reasons explained hereinafter. The single clock mode is manually set by an operator when testing the latching state of data in the registers within the computer system. Therefore, the clock signal is generated in response to the push-button operation by the operator so that one cycle time between clock pulses usually becomes very long, for example, a few seconds to a few minutes. In this case, there is no problem in the case of FIG. 2 because the input timing of the read data clock signal RCLK corresponds to that of the address switching. This means that the signal RCLK is input at the same timing as the ninth clock pulse 9 in the single clock mode. Therefore, even in the single clock mode, the read out data is fully latched in the register RD-REG before the new address affects the read out data.

However, a problem arises in the case of FIG. 3 because the input timing of the signal RCLK does not correspond to the timing of the address switching. That is, the registers ADD-REG and CS-REG are switched at the sixyth clock pulse 6 and the signal RCLK is input at the ninth clock 9. Therefore, the data RAM-RD has been switched before the signal RCLK is input.

To resolve the above problem, conventionally, a delay line DL is used for obtaining the input timing of the signal RCLK. That is, the input timing of the signal RCLK is obtained by delaying the sixth clock pulse 6 for three clock cycles so as to be apparently generated in the timing of the ninth clock pulse 9 even if in the single clock mode. Therefore, this largely delayed clock is made by the delay line DL. However, it is difficult to obtain a precise largely delayed clock signal from the delay line DL because wide dispersions of the delay time occur in the delay line DL. These wide dispersions are caused by, for example, a change of temperature and the precision of manufacture of the delay line.

The apparatus for reading data from a memory according to an embodiment of the present invention will be explained in detail hereinafter.

Figure 4:
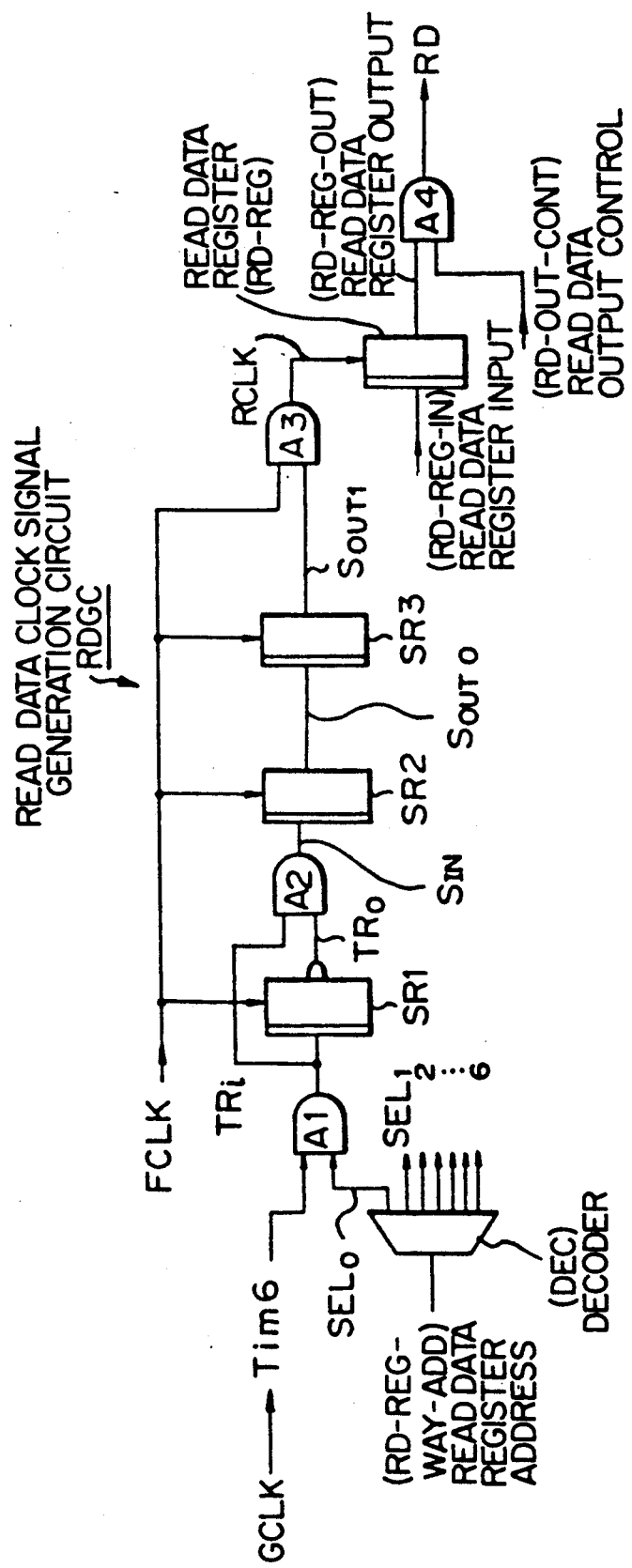
FIG. 4 is a read data clock signal generation circuit according to an embodiment of the present invention.

In FIG. 4, a read data clock signal generation circuit RDGC according to the present invention is provided in a timing generator, (see, FIG. 7) for generating the read data clock signal RCLK. Conventionally, the signal RCLK is obtained, from the delay line DL as shown in FIG. 1, but it is obtained from the circuit RDGC based on the free-running clock FCLK and the gated clock GCLK. SR1 to SR3 represent shift registers, A1 to A4 AND gates, and DEC a decoder. The register RD-REG is the same register as shown in FIG. 1. RD-REG-WAY-ADD is an address signal for selecting the register RD-REG when the memory is a plurality of memory banks. In this case, one memory bank comprises a plurality of the cards shown in FIG. 1. The decoder DEC is provided for selecting the array card and outputting a selection signal SEL. Therefore, a circuit RDGC is provided for every memory bank.

Figure 5:
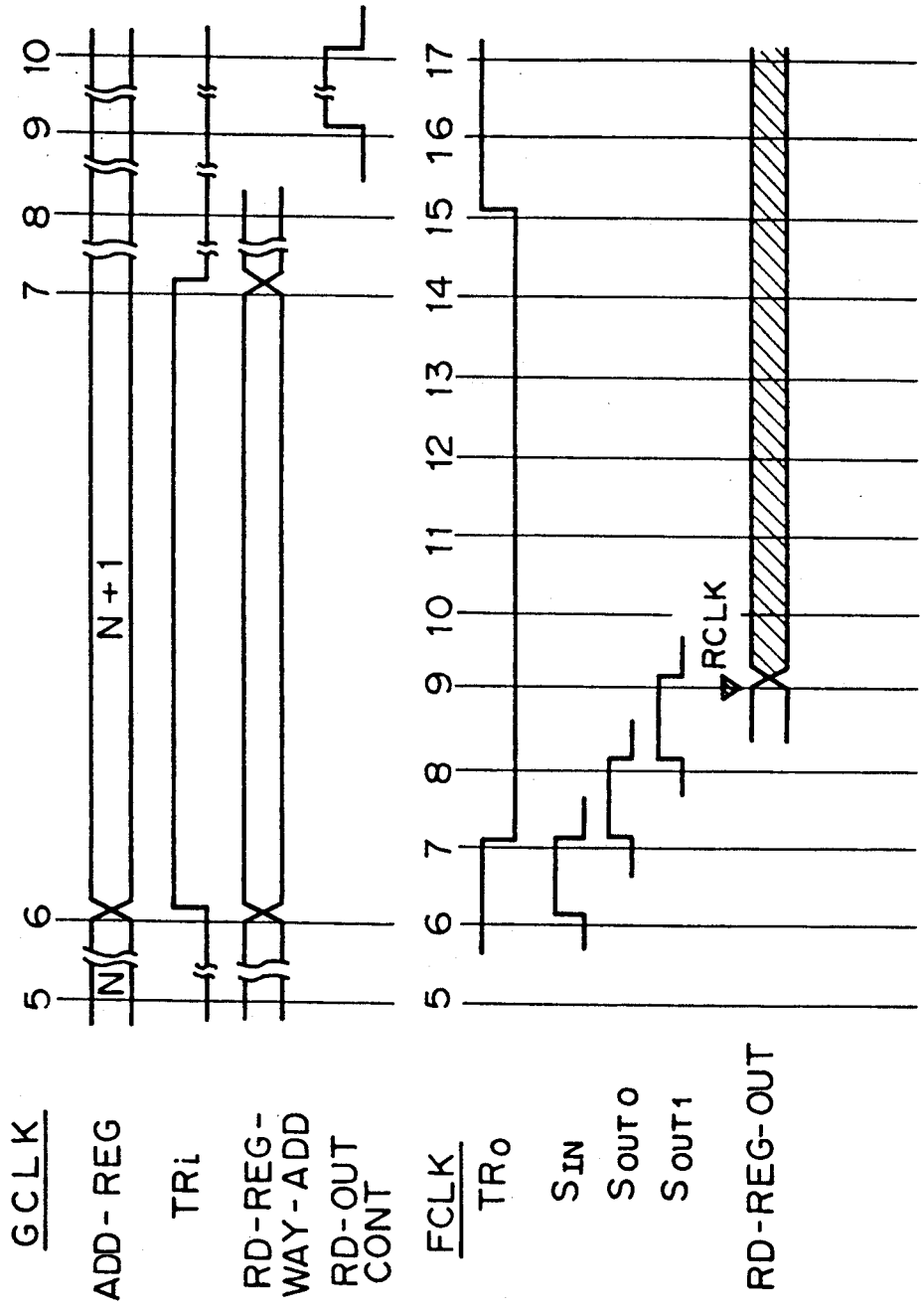
FIG. 5 is a signal timing chart of the circuit shown in FIG. 4; .

The operation of this circuit is explained with reference to FIG. 5.

Figure 7:
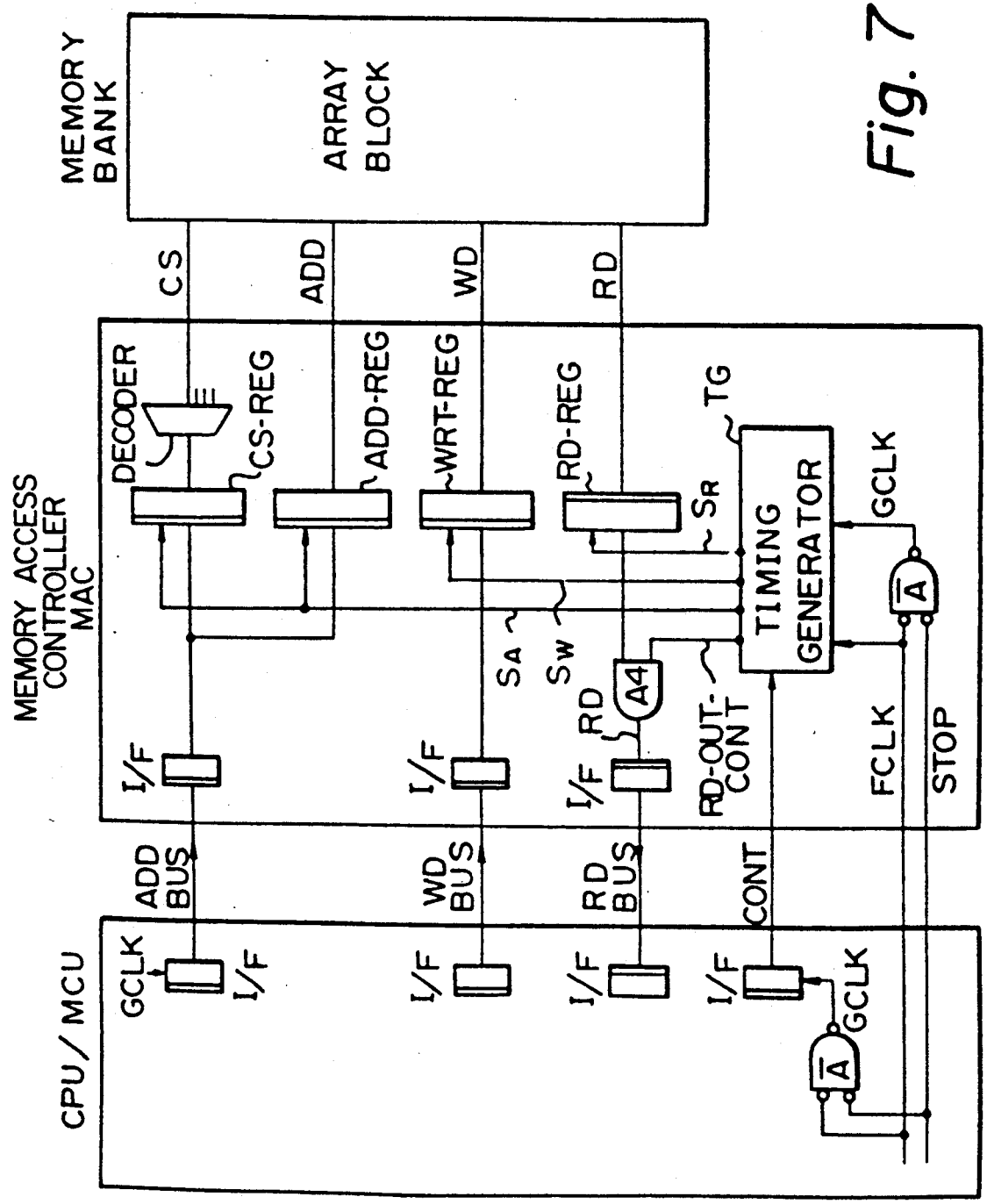
FIG. 7 is a schematic block diagram of a memory access controller including a timing generator according to the present invention.

The free-running clock signal FCLK is generated from the CPU and the gated clock signal GCLK is generated based on the signal FCLK and a stop signal STOP through a negative logic AND gate $\overline{A}$, as shown in FIG. 7. This stop signal STOP is kept at a logical "0" level during the normal clock mode, and is kept at a logical "1" level and made a logical "0" level for a single clock period only by a single push-button operation producing a single clock mode signal during the single clock mode. Tim 6 is the sixth signal of the signal GCLK. In the normal clock mode, the clock cycle time is the same phase between the FCLK and the GCLK. Therefore, the signal timing chart is not shown in FIG. 5 because no problem arises in the normal clock mode. An explanation will be given of the single clock mode shown in FIG. 5, because of the problem that arises in the generation timing of the signal RCLK. In FIG. 5, the upper half and the lower half do not synchronise, except at the sixth clock pulse. The time interval between each GCLK pulse in the upper portion may be a few seconds or a few minutes, but that of the FCLK is a constant period of, for example, a few nano-seconds.

The register ADD-REG is switched, in the single clock mode, at the timing of the sixth clock pulse Tim 6 of the GCLK. In this case, a long interval occurs until the next clock pulse GCLK 7 is input. The trigger signal TRi is generated from the AND gate A1 based on the signal Tim 6 and the selection signal $SEL_0$. The selection signal $SEL_0$ is obtained from the signal RD-REG-WAY-ADD. The first free-running clock pulse (FCLK 6) is input to the shift register SR1 at same timing as the GCLK 6. The first shifted signal $S_{IN}$ is generated from the AND gate A2 based on the trigger signal TRi and the second signal TRo during one cycle (1τ). That is, the signal $S_{IN}$ is obtained by differentiating the signal TRi by in AND gate A2 and the shift register SR1. The signal $S_{IN}$ is shifted by the next clock pulse FCLK 7 and the second shifted signal $S_{OUT0}$ is output from the shift register SR2. Further, the signal $S_{OUT0}$ is input to the shift register SR3 and the third shifted signal $S_{OUT1}$ is output from the shift register SR3 in response to the third clock pulse FCLK 8. The read data clock signal RCLK is obtained from the AND gate A3 based on the clock pulse FCLK 9 and the signal $S_{OUT1}$ after a three cycle time (3τ).

The output data RD-REG-OUT from the register RD-REG is input to the AND gate A4 and output in response to the read-out control signal RD-OUT-CONT generated from GCLK 9. The output data RD is transferred to the register of the next stage.

Figure 6:
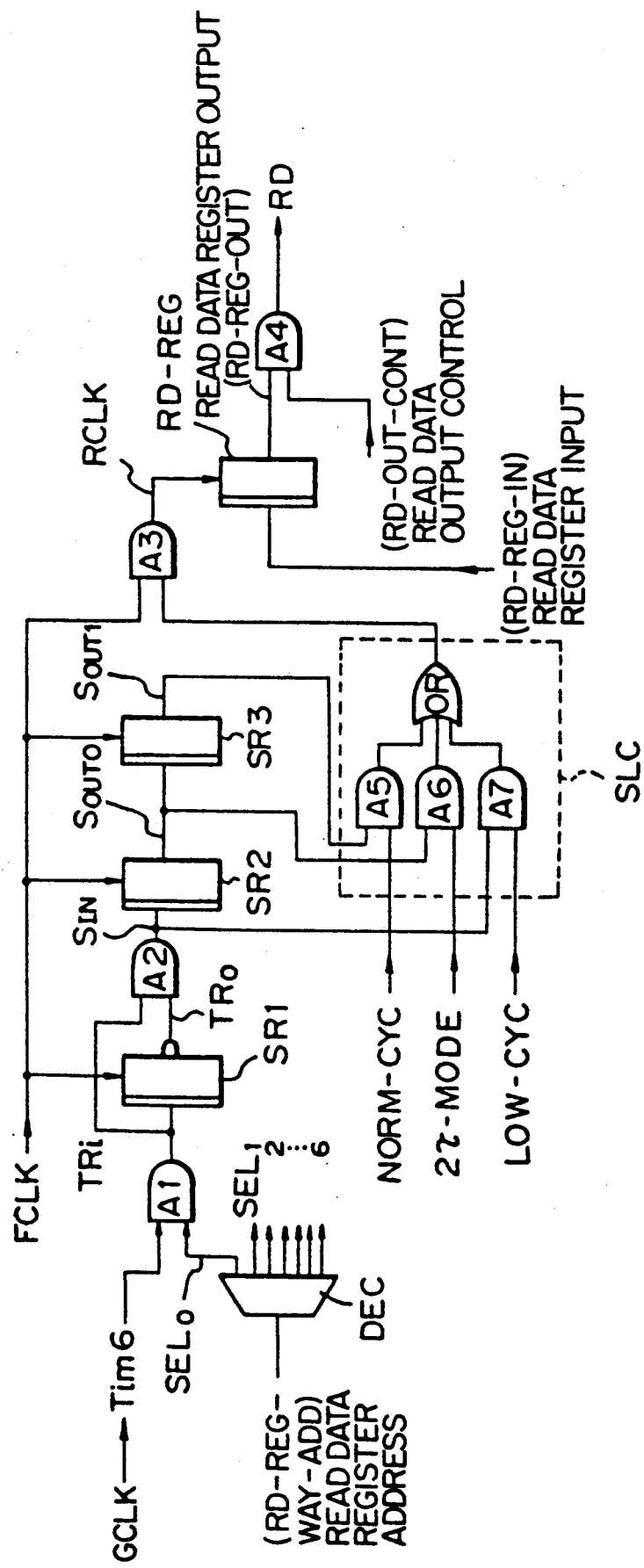
FIG. 6 is a read data clock signal generation circuit according to another embodiment of the present invention.

In FIG. 6, SLC represents a selection circuit. The selection circuit SLC comprises three AND gates A5 to A7 and an OR gate. The NORM-CYC, 2τ-MODE and LOW-CYC represent control signals manually applied by the operator when testing the read data clock signal generation circuit RDGC in response to the change of period of the free-running clock signal FCLK. The signal NORM-CYC is input when the circuit RDGC should be operated by the normal clock signal FCLK having a normal period. The signal 2τ-MODE is input when the period of the clock signal FCLK is doubled. The signal LOW-CYC is input when the period of the clock signal FCLK is tripled. Therefore, the input timing of the signal RCLK can be held to a constant timing by selecting these control signals.

In FIG. 7, CPU/MCU represents a central processing unit including a memory control unit. MAC represents a memory access controller, and I/F an interface latch circuit. TG represents a timing generator including the read data clock signal generation circuit RDGC shown in FIGS. 4 and 6. $S_A$ represents an address set timing signal, $S_W$ a write set timing signal, and $S_R$ a read set timing signal. The signal SR corresponds to the read data clock signal RCLK. Therefore, the register RD-REG corresponds to the register RD-REG shown in FIGS. 4 and 6. An explanation of the signals $S_A$ and $S_W$ is omitted, as these signals are not related to the present invention. $\overline{A}$ represents an AND gate having negative logic function. The gated clock GCLK is generated based on the free-running clock FCLK and the stop signal STOP. The signal GCLK is also input to the interface I/F to synchronize with the operation of the circuit RDGC. The signal RD-OUT-CONT is the same signal as shown in FIGS. 4 and 6, and the AND gate A4 is also the same AND gate as shown in FIGS. 4 and 6. CONT represents a control signal for the timing generator TG and output from the memory control unit MCU in response to the gated signal GCLK.

I claim:

1. An apparatus for reading data from memory in a computer system having a CPU and a free running clock signal having a predetermined constant period of time, said apparatus comprising:

an address register connected to the memory, holding an address signal and supplying the address signal to the memory;

a read data register connected to the memory and holding data read out from the memory;

clock signal generation means receiving the free-running clock signal, for generating a gated clock signal, the gated clock signal being free-running at a specific phase and having the predetermined constant period of time in a normal clock cycle mode and being generated as a single pulse having an interval longer than the predetermined constant period of time in a single clock pulse mode, the specific phase of the gated clock signal being phase at which said address register switches to hold a new address to be supplied to the memory; and shifting means for generating a trigger signal, shifting the trigger signal in accordance with the free-running clock signal, synchronizing he trigger signal with the specific phase of the gated clock signal, the trigger signal having a same timing as the gated clock signal, generating a read data clock signal from the shifted and synchronized trigger signal and providing the read data clock signal to said read data register holding the data read out for the memory, said listing means comprising:

first, second and third shift registers connected in series, each of said shift registers receiving the free running clock signal for the CPU and having an input and an output;

a first AND gate connected between said first and second shift registers, having a first input connected to the input of said first shift register, a second input connected to the output of said first shift register and an output connected to the input of said second shift register, differentiating the trigger signal and providing the differentiated trigger signal to said second shift register; and a second AND gate, having a first input receiving the free-running clock signal from eh CPU, a second input connected to the output of said third shift register, an output connected to said read data register, and synchronizing the shifted trigger signal in accordance with the free-running clock signal.

2. An apparatus according to claim 1, further comprising:

selecting means, connected to said first AND gate, said second shift register, said third shift register and said second AND gate, having a first input receiving the output of said first AND gate, a second input receiving the output of said second shift register, a third input receiving the output of said third shift register and an output connected to the second input of said second AND gate, for selecting and providing one of the differentiated trigger signal, the output of said second shift register and the output of said third shift register to the second input of said second AND gate, in accordance with selection signals.

3. An apparatus according to claim 1, wherein said clock signal generation means includes a gate circuit gating the free-running clock signal in accordance with a stop signal, the stop signal being OFF during the normal clock cycle mode and ON during the signal clock pulse mode except when manually manipulated for a single period of the free-running clock signal.

4. An apparatus according to claim 2, wherein said clock signal generation means includes a gate circuit gating the free-running clock signal in accordance with a stop signal, the stop signal being OIFF during the normal clock cycle mode and ON during the single clock pulse mode except when manually manipulated for a single period of the free-running clock signal.

* * * * *

UNITED STATES PATENT AND TRADEMARK OFFICE
CERTIFICATE OF CORRECTION

PATENT NO. : 5,033,001

DATED : July 16, 1991

INVENTOR(S) : Takashi Ibi

It is certified that error appears in the above-identified patent and that said Letters Patent is hereby corrected as shown below:

```
Item [57] Abstract
    line 2, "includes:" should read --includes--;
        line 19, "hodling" s/b --holding--.
    Col. 2,    line 13, "Fig. 4;." s/b --FIG. 4;--;
               line 43, "by" s/b deleted.
    Col. 3,    line 8, "FIG. 1 a" s/b --FIG. 1 in a--;
               line 18, "T_{LZ}In" s/b --T_{LZ}. In--;
               line 20, "float" s/b --at--;
               line 27, "T_{AA}This" s/b --T_{AA}. This--;
line 40, "Add" should be --ADD--;
               line 68, "sixyth" s/b --sixth--.
    Col. 4,    line 25, "but it is" s/b --but here it is--;
               line 48, "sixth signal" s/b --sixth pulse--;
               line 56, "synchronise" s/b --synchronize--.
```

UNITED STATES PATENT AND TRADEMARK OFFICE
CERTIFICATE OF CORRECTION

PATENT NO. : 5,033,001　　　　　　　　　　　　　Page 2 of 2
DATED : July 16, 1991
INVENTOR(S) : Takashi Ibi It is certified that error appears in the above-identified patent and that said Letters Patent is hereby corrected as shown below:

Col. 5, line 1, "at same" s/b --at the same--;

line 2, "as the GCLK 6." s/b --as GCLK 6.--;

line 6, "by" s/b deleted.

Col. 6, line 14, "he" s/b --the--;

line 34, "eh" s/b --the--.

Signed and Sealed this

Thirtieth Day of March, 1993

*Attest:*

STEPHEN G. KUNIN

*Attesting Officer*　　　*Acting Commissioner of Patents and Trademarks*